(12) United States Patent
Ueki et al.

(10) Patent No.: US 6,483,860 B1
(45) Date of Patent: Nov. 19, 2002

(54) SURFACE EMITTING SEMICONDUCTOR LASER WITH OXIDIZED POST STRUCTURE

(75) Inventors: Nobuaki Ueki, Nakai-machi (JP); Takeshi Nakamura, Nakai-machi (JP); Akemi Murakami, Nakai-machi (JP)

(73) Assignee: Fuji Xerox Co., Ltd., Tokyo (JP)

( * ) Notice: Subject to any disclaimer, the term of this patent is extended or adjusted under 35 U.S.C. 154(b) by 86 days.

(21) Appl. No.: 09/655,061

(22) Filed: Sep. 5, 2000

(30) Foreign Application Priority Data

Oct. 1, 1999 (JP) .......................................... 11-281154
Jun. 8, 2000 (JP) ........................................ 2000-172300

(51) Int. Cl.[7] ................................................ H01S 5/00
(52) U.S. Cl. ...................................................... 372/45
(58) Field of Search ............................. 372/43, 45, 46, 372/50

(56) References Cited

U.S. PATENT DOCUMENTS

| | | | |
|---|---|---|---|
| 5,331,654 A | * 7/1994 | Jewell et al. | 372/45 |
| 5,663,976 A | * 9/1997 | Razeghi | 372/46 |
| 5,915,165 A | * 6/1999 | Sun et al. | 438/47 |
| 5,960,018 A | * 9/1999 | Jewell et al. | 372/45 |
| 6,011,811 A | * 1/2000 | Ohlander et al. | 372/46 |
| 6,075,804 A | * 6/2000 | Deppe et al. | 372/96 |
| 6,106,613 A | * 8/2000 | Sato et al. | 117/54 |
| 6,154,479 A | * 11/2000 | Yoshikawa et al. | 372/96 |
| 6,207,973 B1 | * 3/2001 | Sato et al. | 257/98 |
| 6,304,588 B1 | * 10/2001 | Chua et al. | 372/46 |
| 6,323,052 B1 | * 11/2001 | Horie et al. | 438/46 |

OTHER PUBLICATIONS

Mitzutani et al., "A Low–Threshold Polarization–Controlled Vertical–Cavity Surface–Emitting Laser Grown on GaAs (311)B Substrate", IEEE Phototonics Technology Letters, vol. 10, No. 5, 1998, pp. 633–635.

Ju et al., "Strong polarization selectivity in 780–nm vertical–cavity surface emitting lasers grown on misoriented substrates", Appl. Phys. Lett. 71(6), 1997, pp. 741–743.

* cited by examiner

Primary Examiner—Paul Ip
Assistant Examiner—Davienne Monbleau
(74) Attorney, Agent, or Firm—Oliff & Berridge, PLC

(57) ABSTRACT

The present invention provides a surface emitting semiconductor laser that, with a relatively simple construction, can control the polarization of laser beam to a given direction and obtain a low threshold current and high output. Also, the present invention provides a laser array that has substantially no variations in polarization properties among plural laser devices arranged on a single substrate. In a surface emitting semiconductor laser in which upper and lower reflecting mirror layers are formed on a main face of a semiconductor substrate to sandwich an active layer, at least one of the upper and lower reflecting films including a selective oxidation layer oxidized in a circumferential part thereof, the main face of the semiconductor substrate is tilted with respect to a face containing a reference crystal axis, and the selective oxidation layer is formed by oxidizing a layer to be oxidized from a circumferential part thereof, wherein the circumferential shape of the layer, when cut by a face parallel to the main face, has at least no singular point and is macroscopically smooth.

9 Claims, 8 Drawing Sheets

SURFACE EMITTING SEMICONDUCTOR LASER WITH OXIDIZED POST STRUCTURE

BACKGROUND OF THE INVENTION

1. Field of the Invention

The present invention relates to a surface emitting semiconductor laser and a laser array thereof, and more particularly to a surface emitting semiconductor laser of polarization control type used in optical information processing and optical communications, or as a light source of an image forming apparatus using light, and a laser array in which plural surface emitting semiconductor lasers are arrayed.

2. Description of the Related Art

In laser application technology, which often requires that an emitting spot be circular, since a surface emitting semiconductor laser has the property that an emitting spot can be easily made circular, and can be two-dimensionally integrated, it is in the limelight, centering on the field of communications as a light source having a high degree of usability. By the way, except for surface emitting semiconductor lasers of the so-called distortion type having a distortion quantum well active layer, since surface emitting lasers do not have the anisotropy of oscillation threshold gains within a plane perpendicular to an emission direction, polarized light faces to all directions with an equal probability. That is, they have a different polarization direction for each laser device.

If polarization directions differ depending on laser devices, where optical devices having polarized wave dependence such as mirrors and polarization beam splitters not provided with special coatings are used in combination, a change in optical properties occurs in light beams having passed through the optical devices. Use of a large number of laser devices by use of an identical optical system would cause variations in light quantities and other problems because of the influence of polarization properties different for each laser device. For this reason, efforts have been so far made to stabilize the polarization of laser devices to one direction.

Although various methods for polarization control has been heretofore devised, they cannot be said to be satisfactory in terms of perfect control, and polarization control methods are presently contemplated in various quarters.

Recently, a polarization control method using a tilted substrate has become dominant.

There is described in "IEEE Photonics Technology Letters", Tenth Volume, page 633, a surface emitting laser of selective oxidation type of an indium gallium arsenic (InGaAs) system that uses a tilted substrate with gallium arsenic (GaAs) (311) B face as anormal direction. An optical wave (active) region formed by selective oxidation is of rectangular shape having a diameter of 6 $\mu$m×3 $\mu$m, with a major axis in [−233] direction and a polarization direction also in the [−233] direction. By using such an extremely special tilted substrate, the surface emitting laser of selective oxidation type provides the properties of polarization mode suppression ratio 30 dB or more.

Although this method seems to be highly effective for polarization control, since the GaAs tilted substrate with the (311) B face as a normal direction is designed for special uses, it is more expensive than general-purpose substrates with (100) face as a normal direction. Since crystal growth is different in condition from growth on the (100)face, which is widely performed, huge costs and a great deal of time will be required to find growth conditions excellent in reproducibility for actual use.

There is described in "Applied Physics Letters", 71st Volume, page 741, a surface emitting laser of proton injection type of an aluminum gallium arsenic (AlGaAs) system fabricated using a (001) substrate (different in notation from the above (100) substrate and crystallographically denotes an equivalent crystal face orientation) tilted by approximately 2° toward (111) A direction. The surface emitting laser of proton injection type has the property of a polarization mode suppression ratio exceeding 400 at the maximum. The substrate tilted by approximately 2° used herein is easily available because of widespread use as a low dislocation (highly smooth) substrate and has almost the same crystal growth condition as when a substrate not tilted is used. Therefore, this method can be said as a simple method for polarization control.

However, an obtained laser is a surface emitting laser of proton injection type.

Since a laser of proton injection type is a device employing heat caused by current injection called thermal lens effects, it has the following property problems attributed to its construction: (1) a current must keep being injected for a certain period of time to form a waveguide by heat, which is required to cause laser oscillation; and (2) the light response property is bad in addition to a threshold current as high as several milliamperes. For this reason, recently, a surface emitting laser of selective oxidation type is going mainstream which narrows a current and confines light by forming an oxidation region and thereby provides high output with a low threshold current. However, in the surface emitting laser of selective oxidation type, since it is known that the shape of an oxidation region affects the polarization property, and the polarization property is highly governed by a fabrication process history, the polarization direction of the surface emitting laser of selective oxidation type cannot be sufficiently controlled in the same way for a surface emitting laser of proton injection type.

The surface emitting laser of proton injection type described in the above literature provide a polarization mode suppression ratio of 100 or more before a light output value reaches a peak, and is required to provide higher output and be capable of controlling polarization.

Although a laser array driven with plural laser devices arranged is particularly required to be controlled so that the polarization directions of the devices are identical, a measured polarization mode suppression ratio is merely for one device, and it is not guaranteed that, when the devices are formed into an array, all of the devices would exhibit the same property without variations in polarization directions.

SUMMARY OF THE INVENTION

Therefore, the present invention has been made in view of the above circumstances and provides a surface emitting semiconductor laser that, with a relatively simple construction, can control the polarization of laser beam to a given direction and obtain a low threshold current and high output. Also, the present invention provides a laser array that has no variations in polarization properties among plural laser devices arranged on a single substrate.

According to an aspect of the present invention, the surface emitting semiconductor laser has upper and lower reflecting films formed on a main face of a semiconductor substrate to sandwich an active layer, at least one of the upper and lower reflecting films including a selective oxidation layer oxidized in a circumferential part thereof, wherein the main face of the semiconductor substrate is tilted with respect to a face containing a reference crystal axis, and the selective oxidation layer is formed by oxidizing a layer to be oxidized from a circumferential part thereof, wherein the circumferential shape of the layer, when cut by a face parallel to the main face, has at least no singular point and is macroscopically smooth.

According to the present invention, by using a semiconductor substrate tilted with respect to a face containing a reference crystal axis, oxidizing a layer whose circumferential shape has substantially no singular point and is macroscopically smooth, from a circumferential part thereof, and forming a selective oxidation layer selectively oxidized in a circumferential part thereof, a non-oxidation region having a circumferential shape almost analogous to the circumferential shape of the oxidation layer is formed, the anisotropy of oscillation threshold gains of optical mode is induced, and polarization is controlled to a given direction without causing switching or the like.

Since the passage of little current through the oxidation region causes a refractive index waveguide to be formed within a face parallel to the main face of the semiconductor substrate to narrow a current and confine light, devices having excellent properties such as stable horizontal mode and low threshold current are obtained.

According to another aspect of the present invention, in the surface emitting semiconductor laser, the face containing the reference crystal axis has a crystal face orientation crystallographically equivalent to the (100) face.

According to another aspect of the present invention, in the surface emitting semiconductor laser of the present invention, the main face is tilted at an angle in the range from −5° to +5° to [110] direction with respect to [100] direction.

According to another aspect of the present invention, in the surface emitting semiconductor laser of the present invention, when the layer to be oxidized is cut by a face parallel to the main face, a circumferential shape thereof is circular or elliptic.

According to another aspect of the present invention, in the surface emitting semiconductor laser of the present invention, when the layer to be oxidized is cut by a face parallel to the main face, the circumferential shape is elliptic, and the direction of the major axis is [011] or [01-1] direction.

According to another aspect of the present invention, in the surface emitting semiconductor laser of the present invention, the non-oxidation region of the selective oxidation layer has a diameter within a range in which fundamental transverse mode oscillation is obtained.

According to the above-described aspects of the present invention, since each of the aspects provides an optimum condition for deriving the anisotropy of oscillation threshold gains of optical mode, synergistic effects of these aspects provide further increased polarization control for the surface emitting semiconductor laser.

According to another aspect of the present invention, in the surface emitting semiconductor laser of the present invention, an upper wiring is disposed at an upper portion of an emission part in a direction extended at an angle in the range from at least −10° to +10° with respect to the projection of the reference crystal axis to the semiconductor substrate main face.

According to the present invention, since stress is applied to an active region along a wiring direction because of the difference of thermal expansion coefficients between the wiring and materials disposed at lower portions of the wiring, by making an off angle direction of the substrate and the extension direction of the wiring almost identical, anisotropy attributed to the stress dependence of oscillation threshold gains occurs and the surface emitting semiconductor laser with polarization controlled to a given direction can be obtained.

According to another aspect of the present invention, the laser array has the plural surface emitting semiconductor lasers of the present invention arranged on a single substrate, i.e. monolithic.

According to another aspect of the present invention, equally in the laser devices, the anisotropy of oscillation threshold gains of optical mode is induced and polarization is controlled to a given direction. Therefore, the laser array without substantial variations in polarization properties among the laser devices can be obtained.

According to another aspect of the present invention, in the laser array of the present invention, an upper wiring is disposed at an upper portion of an emission part in a direction extended at an angle in the range from at least −10° to +10° with respect to the projection of the reference crystal axis to the semiconductor substrate main face.

According to the present invention, since stress uniform in directionality among plural devices is applied to an active layer, the surface emitting semiconductor laser array without sybstantial variations among the devices and with identical polarization directions can be obtained.

BRIEF DESCRIPTION OF THE DRAWINGS

Preferred embodiments of the present invention will be described in detail based on the followings, wherein.

DESCRIPTION OF THE PREFERRED EMBODIMENTS

Hereinafter, embodiments of the present invention are described with reference to FIGS. 1 to 6.

(First Embodiment)

Figure 1A:
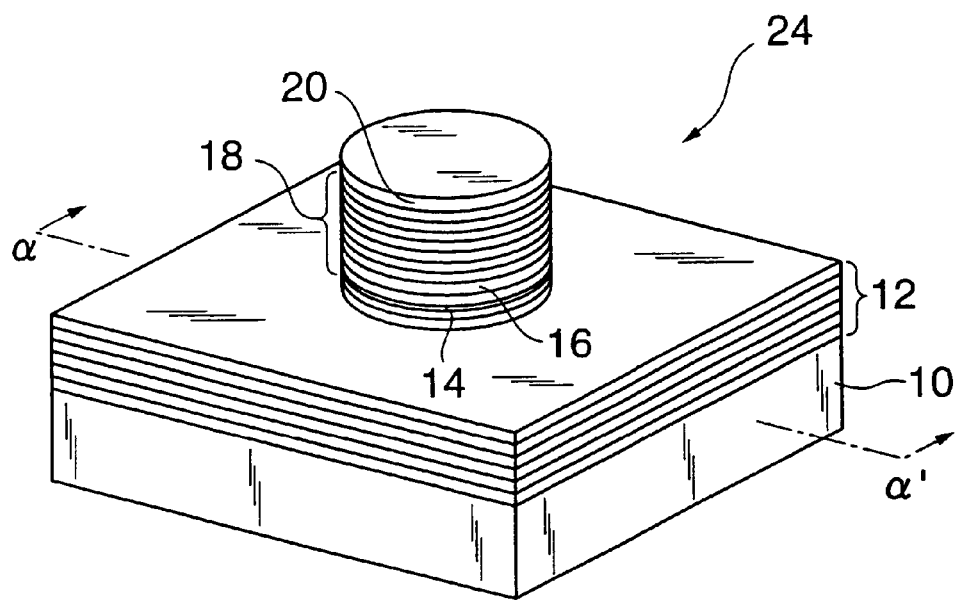
FIG. 1A is a schematic perspective view of a surface emitting semiconductor laser of a first embodiment of the present invention.
Figure 1B:
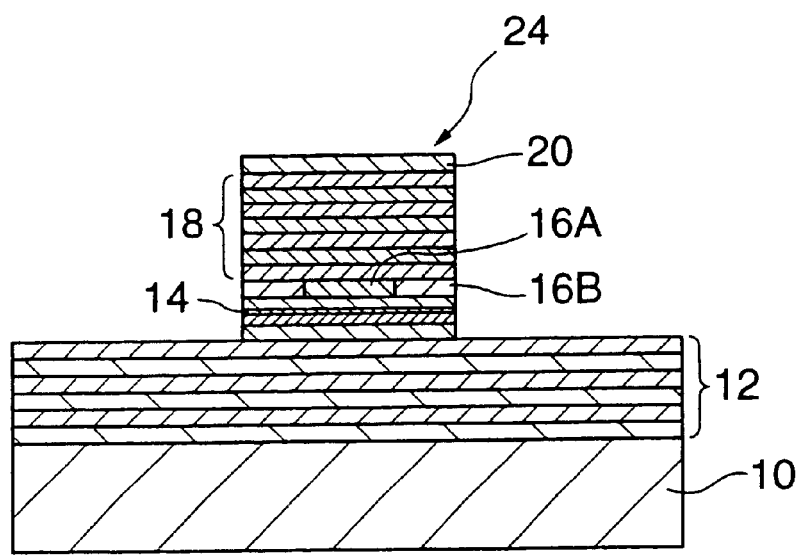
FIG. 1B is a cross section taken along the line α–α' of FIG. 1A.
Figure 2A:
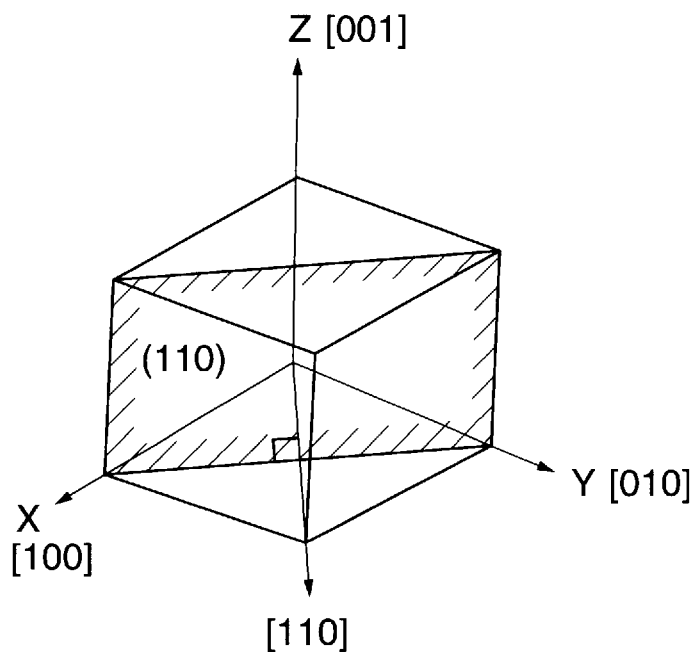
FIG. 2 illustrates the crystallographic face orientation of a semiconductor substrate in the surface emitting semiconductor laser of the first embodiment of the present invention.
Figure 2B:
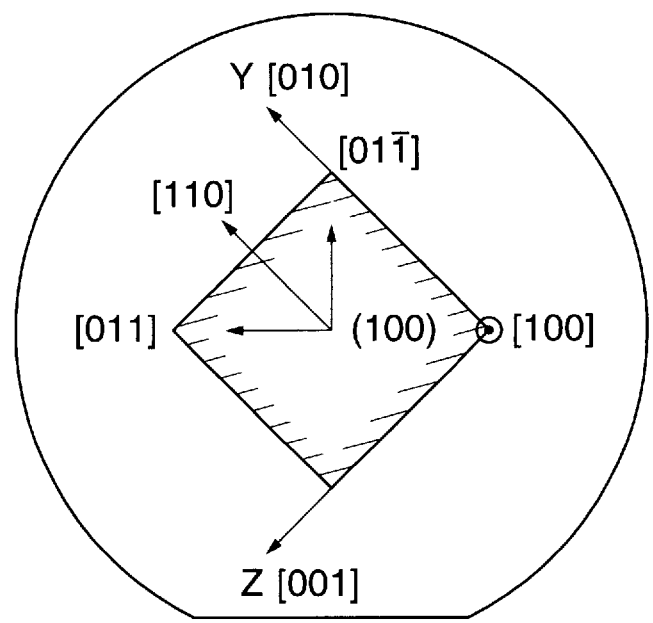

As shown in FIGS. 1A and 1B, a surface emitting semiconductor laser of a first embodiment is a surface emitting semiconductor laser device of top face emission type that has a cylindrical post part 24 with an active region 14 and a selective oxidation layer 16 formed, and its substrate has a crystallographic face orientation of approximately 2° off, which is an angle formed by a tilt from (100) to the [110] direction, which is the direction of the normal to the (110) face shown in FIG. 2A. The crystalline orientation of a semiconductor wafer is shown in FIG. 2B. The substrate face is (100) and a direction formed by a tilt in the [010] direction at an elevation angel 45° from the normal of the plane is the [110] direction. Details are given below.

Although not shown in detail, on an n-type GaAs tilted substrate 10 is disposed an n-type first reflecting mirror layer 12 having a carrier concentration of $2\times10^{18}$ cm$^{-3}$ formed by alternately stacking at 40.5 periods an n-type $Al_{0.9}Ga_{0.1}As$ film $\lambda/(4n_r)$ thick ($\lambda$: oscillation wavelength, $n_r$: refractive index of medium) and an n-type $Al_{0.3}Ga_{0.7}As$ film $\lambda/(4n_r)$ thick which are doped with an n-type impurity, silicon (Si).

At the center of the upper face of the n-type first reflecting mirror layer 12 is disposed a spacer layer 14 made of undoped $Al_{0.5}Ga_{0.5}As$ which has a quantum well active layer (not shown), formed by alternately stacking a four-layer undoped $Al_{0.3}Ga_{0.7}As$ barrier layer 5 nm thick and a three-layer undoped $Al_{0.11}Ga_{0.89}As$ well layer 8 nm thick.

The film thickness of the spacer layer 14 containing the quantum well active layer is set to be equal to an integer multiple of $\lambda/n_r$ so that standing waves are held. That is, the surface emitting semiconductor laser is designed so that, when functioning as a surface emitting semiconductor laser, the so-called "anti-node" portion having the highest light intensity overlaps on the region of the quantum well active layer (not shown) disposed in the vicinity of the center of the spacer layer 14.

On the upper face of the spacer layer 14 is stacked an AlAs layer 16A, which is higher in Al composition ratio than the $Al_{0.9}Ga_{0.1}As$ film and the $Al_{0.3}Ga_{0.7}As$ film which constitute the reflecting mirror layer, and is susceptible to oxidation by thermal processing under water vapor atmosphere, and the circumferential part of the AlAs layer 16A is subsequently selectively oxidized to form a circumferential oxidation region 16B. Herein, a layer including the AlAs layer 16A left unoxidized and the circumferential oxidation region 16B is referred to as a selective oxidization layer 16.

Although not shown in detail, on the upper face of the AlAs layer 16A are disposed a p-type second reflecting mirror layer 18 having a carrier concentration of $3\times10^{18}$ cm$^{-3}$ formed by alternately stacking at 30 periods a p-type $Al_{0.9}Ga_{0.1}As$ film $\lambda/(4n_r)$ thick doped with carbon (C) and a p-type $Al_{0.3}Ga_{0.7}As$ film $\lambda/(4n_r)$ thick, and a p-type GaAs contact layer 20 10 nm thick having a carrier concentration of $1\times10^{20}$ cm$^{-3}$ doped with C. By processing the substrate having such a layer structure, a nearly cylindrical post part 24 is formed.

The p-type second reflecting mirror layer 18 has fewer periods (layers) than the n-type first reflecting mirror layer 12 described previously, and is designed so that an optical refractive index for laser is smaller than that of the n-type first reflecting mirror layer 12. Due to the difference of refractive indexes, emitted light is taken out from the upper face of the post part 24. Although not shown, between the p-type $Al_{0.9}Ga_{0.1}As$ film and the p-type $Al_{0.3}Ga_{0.7}As$ film which constitute the p-type second reflecting mirror layer 18 are stagedly disposed middle layers having a middle Al composition ratio, contributing to lowering serial resistance of devices.

Hereinafter, the process of fabricating a surface emitting semiconductor laser constructed as described above is described with reference to FIGS. 3 to 5.

Figure 3:
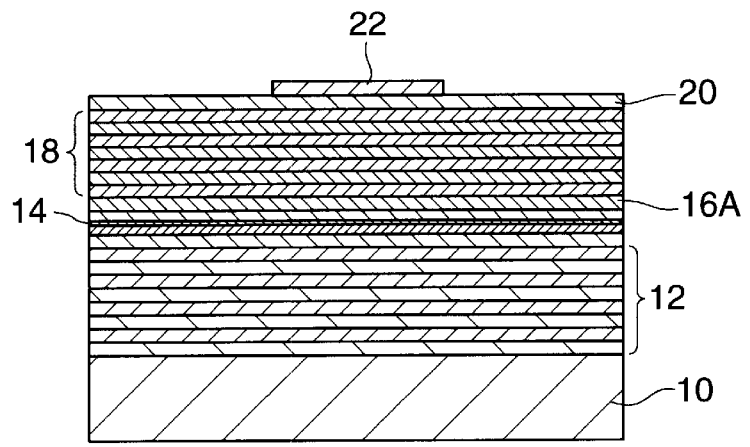
FIG. 3 is a schematic view showing the status of the surface emitting semiconductor laser of the first embodiment of the present invention, after termination of a stacking process in the fabrication method thereof.

As shown in FIG. 3, on the n-type GaAs substrate 10 are successively disposed using semiconductor crystal growth technology such as metal organic chemical vapor deposition (MOCVD) and molecular beam epitaxy (MBE) (stacking process): the n-type first reflecting mirror layer 12 formed by alternately stacking then-type $Al_{0.9}Ga_{0.1}As$ film and the n-type $Al_{0.3}Ga_{0.7}As$ film; the undoped $Al_{0.5}Ga_{0.5}As$ spacer layer 14 having the quantum well active layer (not shown) at the central portion thereof; the AlAs layer 16A adjusted to have a higher Al composition ratio than the $Al_{0.9}Ga_{0.1}As$ film and the $Al_{0.3}Ga_{0.7}As$ film; the p-type second reflecting mirror layer 18 formed by alternately stacking the p-type $Al_{0.9}Ga_{0.1}As$ film and the p-type $Al_{0.3}Ga_{0.7}As$ film via an intermittent layer (not shown); and the p-type GaAs contact layer 20.

Figure 4:
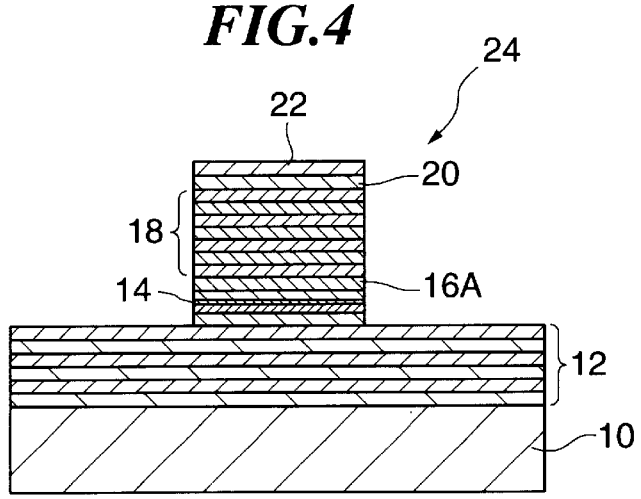
FIG. 4 is a schematic view showing the status of the surface emitting semiconductor laser of the first embodiment of the present invention, after termination of an etching process in the fabrication method thereof.

After depositing a silicon insulating film 22 on the entire face of the above multilayer film, it is processed to a circular shape 20 to 50 μm in diameter, using photolithography technology. Next, as shown in FIG. 4, reactive ion etching is performed using the insulating film 22 as an etching mask and a cylindrical post part is formed by performing etching until the n-type first reflecting mirror layer 12 is exposed.

Figure 5:
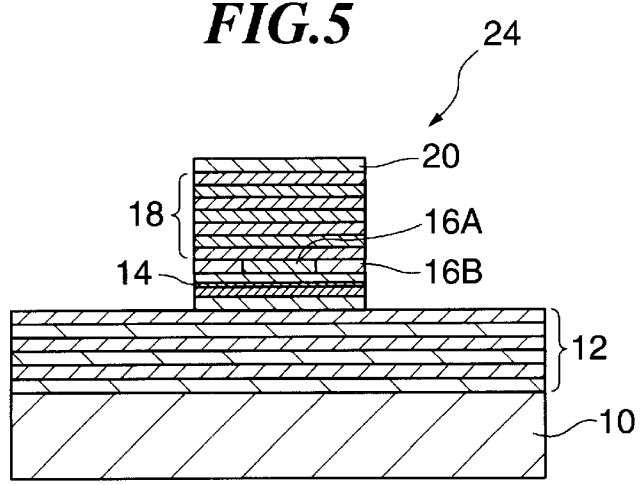
FIG. 5 is a schematic view showing the status of the surface emitting semiconductor laser of the first embodiment of the present invention, after termination of an oxidation process in the fabrication method thereof.

Thereafter, 10-minute thermal processing is performed by heating to 400° C. within a quartz tube filled with water vapor. Thereby, as shown in FIG. 5, the AlAs layer 16A exposed to the side of the cylindrical post part is gradually oxidized inwardly from the circumferential part so that the circumferential oxidization region 16B is formed. The diameter of an unoxidized region left inside without being oxidized differs according to the diameter of the cylindrical post part; typically, 3.5 μm or less is suitable for the implementation of the present invention.

Thereafter, using photolithography technology, at the surface of the GaAs substrate 10, a p-face electrode having an opening for taking out light is formed on the upper face of the post part 24 via the insulating protection film, while an n-face electrode is formed wholly at the back, whereby a surface emitting semiconductor laser having an oscillation wavelength from λ to 780 nm is obtained.

Figure 6A:
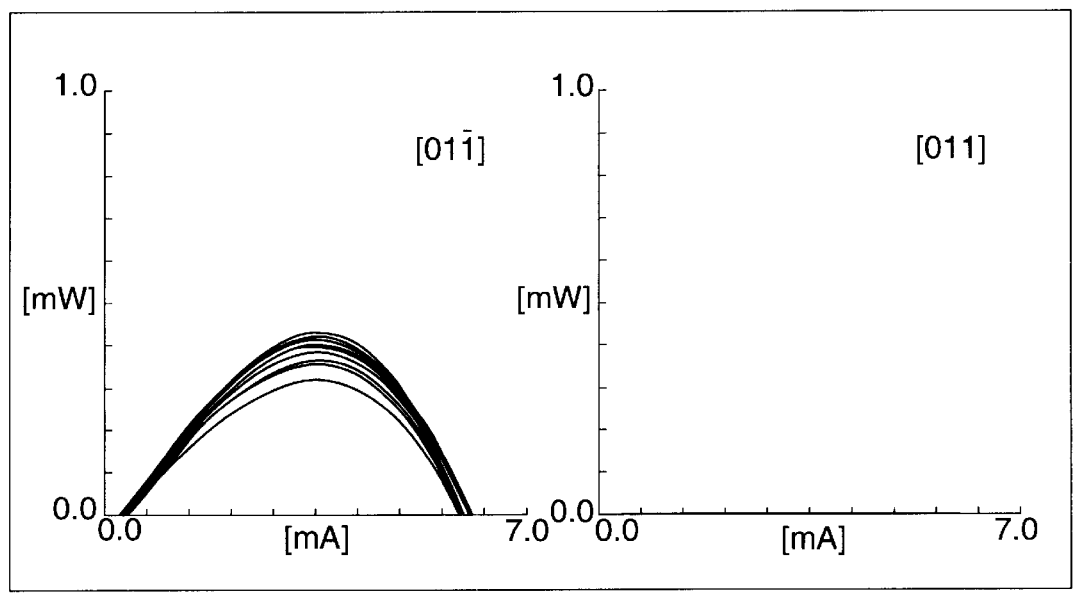
FIG. 6A is a graph of I-L properties obtained by polarization and separation to two directions intersecting at right angles in the surface emitting semiconductor laser of the first embodiment of the present invention.
Figure 6B:
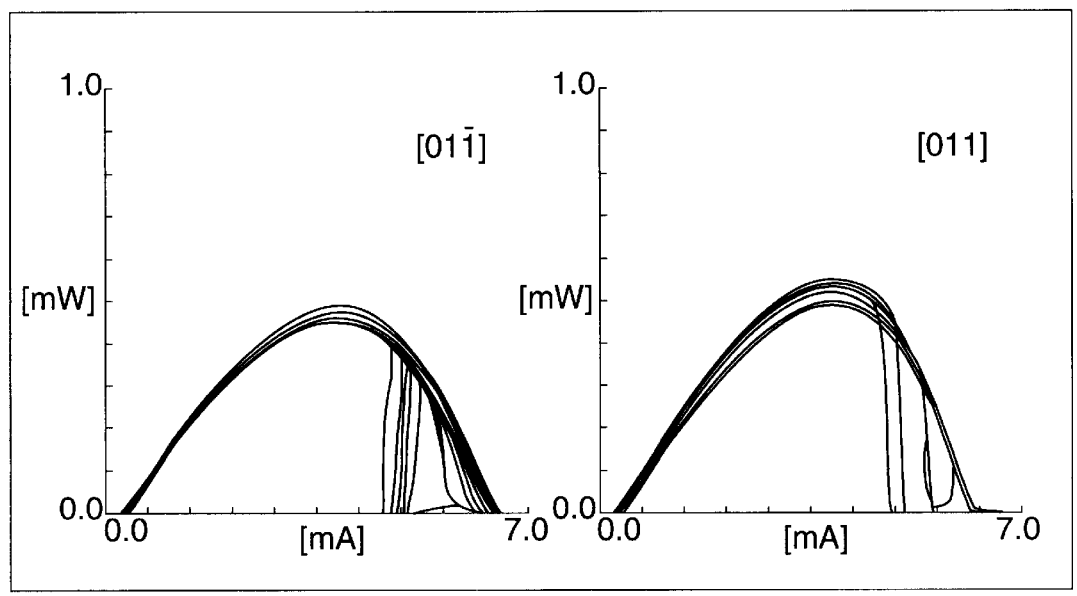
FIG. 6B shows the properties of a square-shaped post device measured for the purpose of comparison.

Polarization I-L properties obtained in such a device are shown in FIG. 6. The polarization I-L properties represent how light output has changed against an injected current when a polarizing prism is changed by 90°. The left indicates light output to [01-1] direction and the right indicates light output to [011] direction. For the purpose of comparison, there are also shown polarization I-L properties obtained in a device having a square-shaped post part obtained by the same process.

It will be appreciated from FIG. 6 that, in a device having a cylindrical post part (a), the polarization direction of all of 16 devices is controlled to [01-1] direction (equivalent to the normal direction of an orientation flat part of the semiconductor wafer shown in FIG. 2B), while in a device having a square-shaped post part (b), the polarization direction is not fixed, switching of polarization direction occurs for specific current values, and polarization is not sufficiently controlled.

In the first embodiment described above, although a semiconductor substrate tilted by approximately 2° off from [100] to the [110] direction with respect to it is used, the present invention is not limited to this. For example, the same effect is obtained for a substrate tilted by approximately 2° toward [1-10] direction in a positional relation symmetrical with the [110] direction with respect to the [001] direction. Experiments showed that an effect began developing in the vicinity of a tilt angle 0.5° and increased gradually, and when a tilt angle exceeded 5°, reached such a level that influence on crystal growth conditions could not be ignored. Therefore, a range from −5° to 5° is reasonable.

Although, in the first embodiment, the shape of the cylindrical post part is cylindrical corresponding to the shape of the silicon insulating film 22 used as an etching mask, the present invention is not limited to the cylindrical shape of the cylindrical post part. For example, the same effect can be obtained for an elliptical shape of the etching mask if the circumferential shape of the margin as viewed from over the substrate is a curve that has at least no singular point and is macroscopically smooth. To make polarization more stable, it is desirable that the post part should be fabricated to a shape that has a major axis (long axis) and a minor axis (short axis), such as an elliptical shape that easily causes gain anisotropy. Experiments by the inventor demonstrated that satisfactory polarization properties free of variations were obtained where the direction of a major axis was the [011] direction or [01-1] direction, but variations occurred where the direction of the major axis was set to a middle direction of them. Therefore, for a shape that has a major axis and a minor axis, such as an elliptical shape, it is desirable that the direction of the major axis is the [011] direction or [01-1] direction. The term "columnar shape" includes columnar shapes that an upper face is larger or smaller than a lower face, without being limited to shapes that an upper face and a lower face are dimensionally equal.

In the first embodiment, the AlAs layer 16A exposed to the side of the cylindrical post part is gradually oxidized inwardly from the circumferential part so that the circumferential oxidation region 16B is formed, and the diameter of an internal region (unoxidized region) left without being oxidized is 3.5 μm or less, which is a value of a diameter within a range in which fundamental transverse mode oscillation is obtained in an entire injection current range. Actually, depending upon the position of a circumferential oxidation region from an active layer in a substrate multilayer direction, even if the diameter exceeds 3.5 μm, 0-th mode oscillation may be obtained, in which case the diameter may exceed 3.5 μm. fundamental transverse mode oscillation is not always obtained in the entire injection current range, and even in the case where a high-order mode develops as an injected current increases, the same polarization control effect is observed. Typical selective oxidation-type lasers are available for use if the diameter of an unoxidized region is 5 μm or less.

(Second Embodiment)

In a second embodiment, a metallic wiring extended in a specific direction is added at an upper portion of a post of the same surface emitting semiconductor laser device as that of the above described first embodiment.

A surface emitting semiconductor laser device of the second embodiment is the same as that of the first embodiment in that it includes the n-type first reflecting mirror layer 12, the spacer layer 14, the AlAs layer 16A, the second reflecting mirror layer 18, and the contact layer 20, wherein the circumferential oxidation region 16B is formed by oxidizing the circumferential part of the AlAs layer 16A. Therefore, the above configuration is not described.

Figure 7:
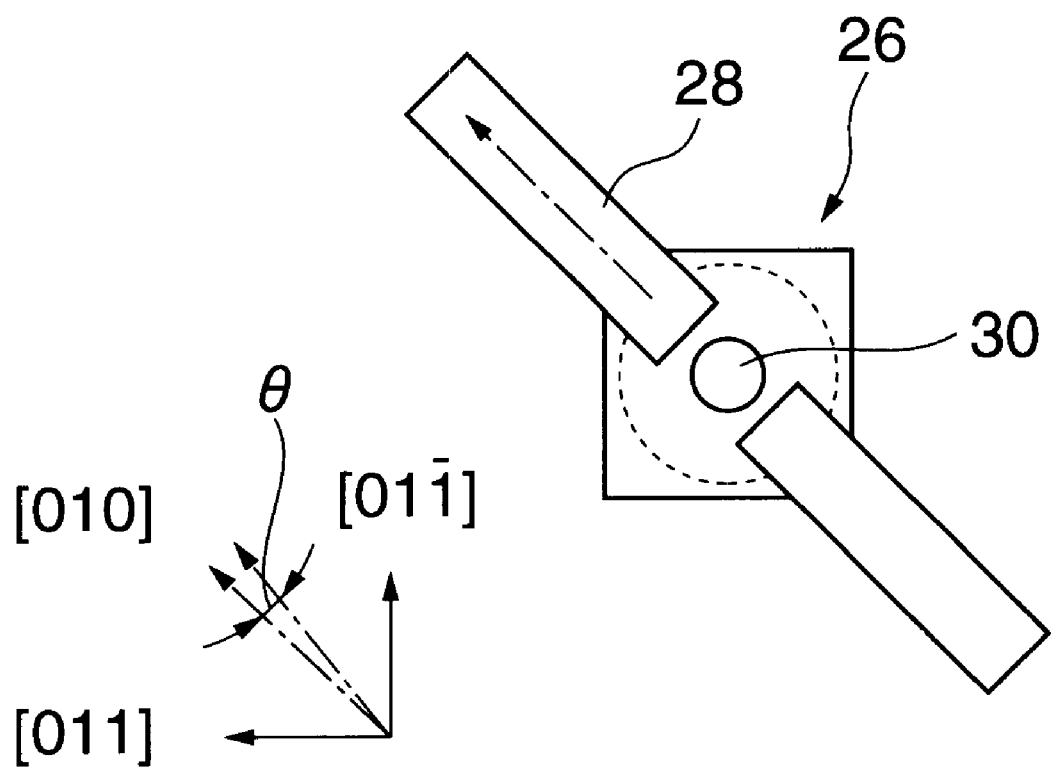
FIG. 7 is a top view of the surface emitting semiconductor laser of a second embodiment of the present invention.

When forming an upper electrode 28 of a surface emitting laser device 26 of selective oxidation type formed on the n-type GaAs substrate 10, wirings are made so that the off angle direction of the substrate and the extension direction of the wirings match, as shown in FIG. 7. However, to take out light output from the upper face, a light emission window 30 is provided at a proper location.

Figure 8A:
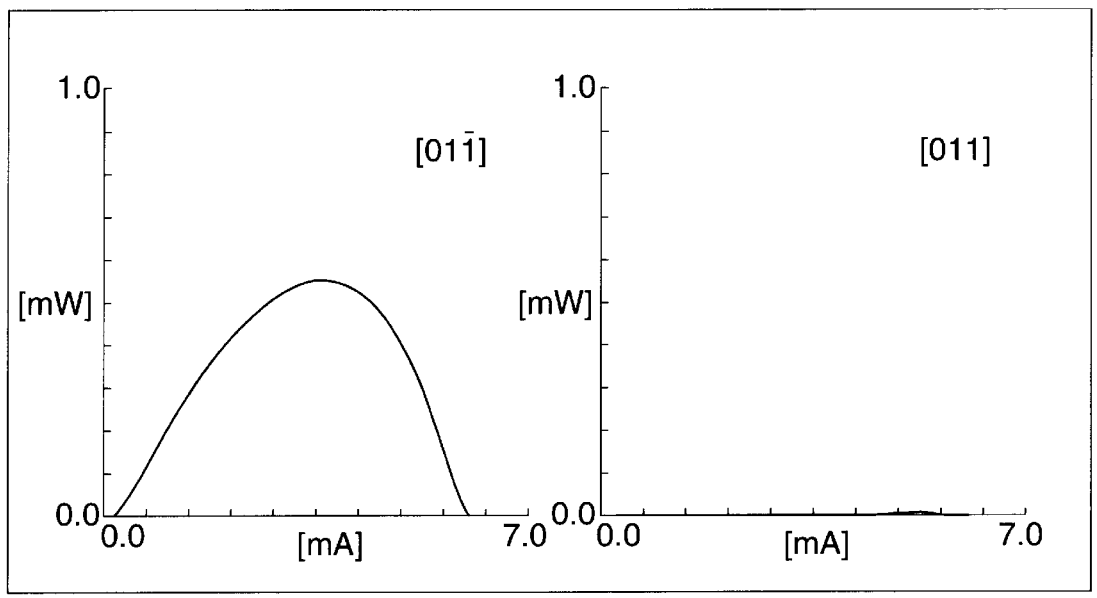
FIG. 8A is a graph of I-L properties obtained by polarization and separation to two directions intersecting at right angles in the surface emitting semiconductor laser of the second embodiment of the present invention.
Figure 8B:
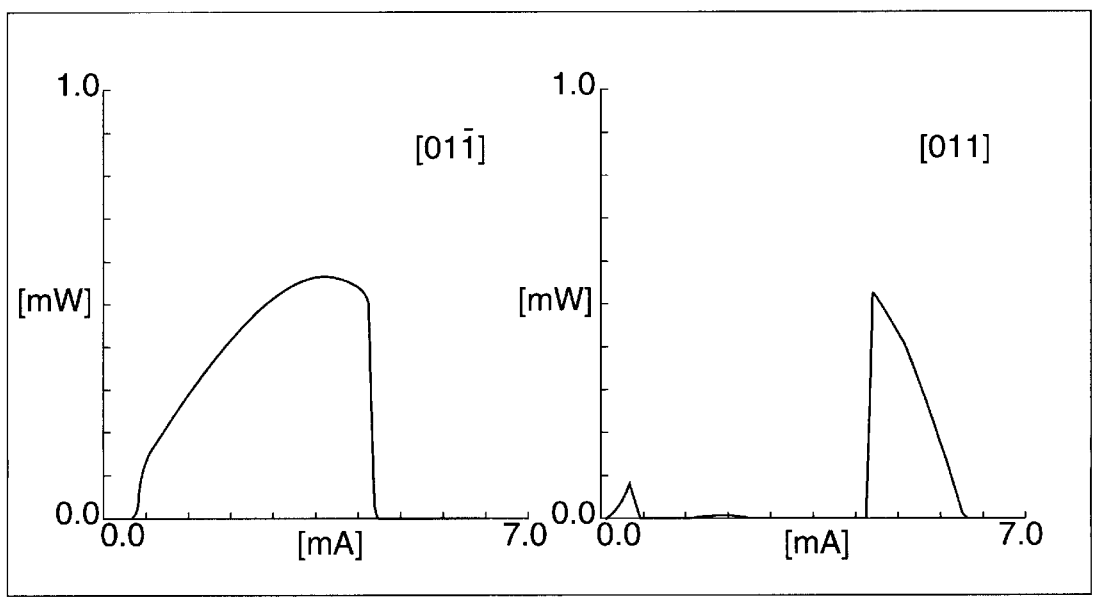
FIG. 8B shows the properties, measured for the purpose of comparison, of a device that the off angle direction of the substrate and the extension direction of the wirings intersect at right angles.

FIG. 8 shows polarization I-L properties obtained in such a state. For the purpose of comparison, there are also shown polarization I-L properties obtained for a device different from the above by 90° in the extension direction of the wirings. It will be appreciated from FIG. 8 that, for a device (a) matching between the off angle direction of the substrate and the extension direction of the wirings, polarization directions are perfectly controlled to the [01-1] direction, while, for a device (b) that the off angle direction of the substrate and the extension direction of the wirings intersect at right angles, switching of polarization direction occurs in specific current values and polarization is not controlled. "Matching between the off angle direction of the substrate and the extension direction of the wirings" referred to herein denotes that the angle θ between the direction of the projection of a reference crystal axis to the (100) substrate main face and the extension direction of the wirings is as close as possible to 0° within the substrate plane. This condition is satisfied in an angle range of at least −10° and +10°.

(Third Embodiment)

Figure 9:
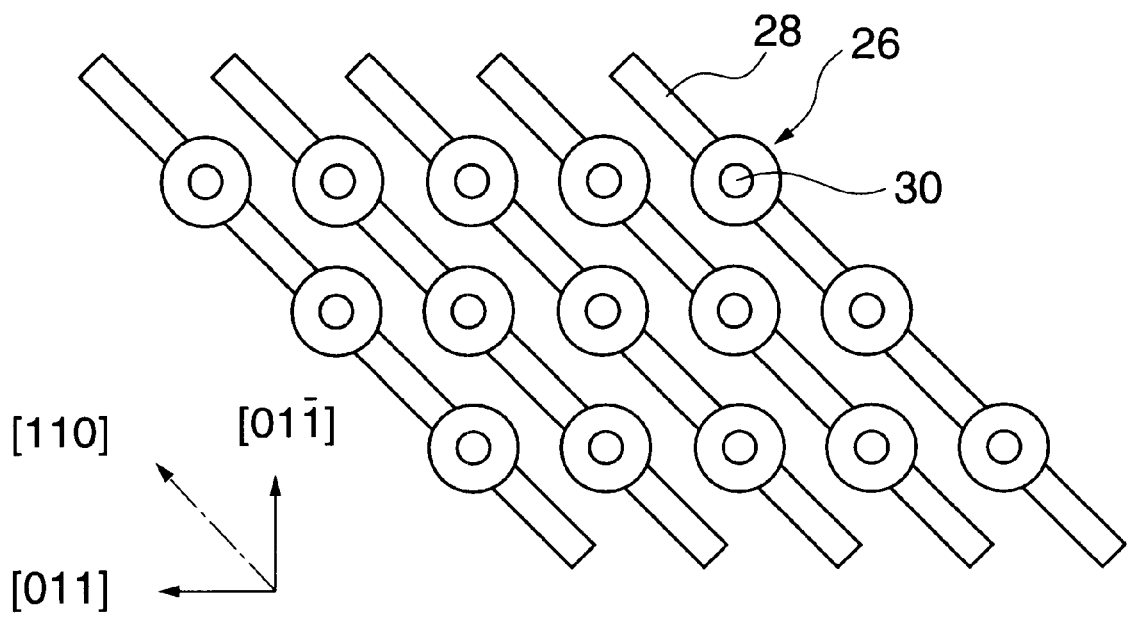
FIG. 9 is a top view of a surface emitting semiconductor laser array of the second embodiment of the present invention.

In a third embodiment, as shown in FIG. 9, an array of the surface emitting semiconductor laser devices 26 of the second embodiment is formed by periodically arranging them. Herein, the upper electrodes 28 are common in a specific columnar direction, and if lower electrodes (not shown) are also common, simultaneous driving of specific columns is assumed; if the lower electrodes are individually connected, independent driving is assumed. However, there is no difference between both cases in controllability of polarization directions, which is the theme of the present invention.

Figure 10A:
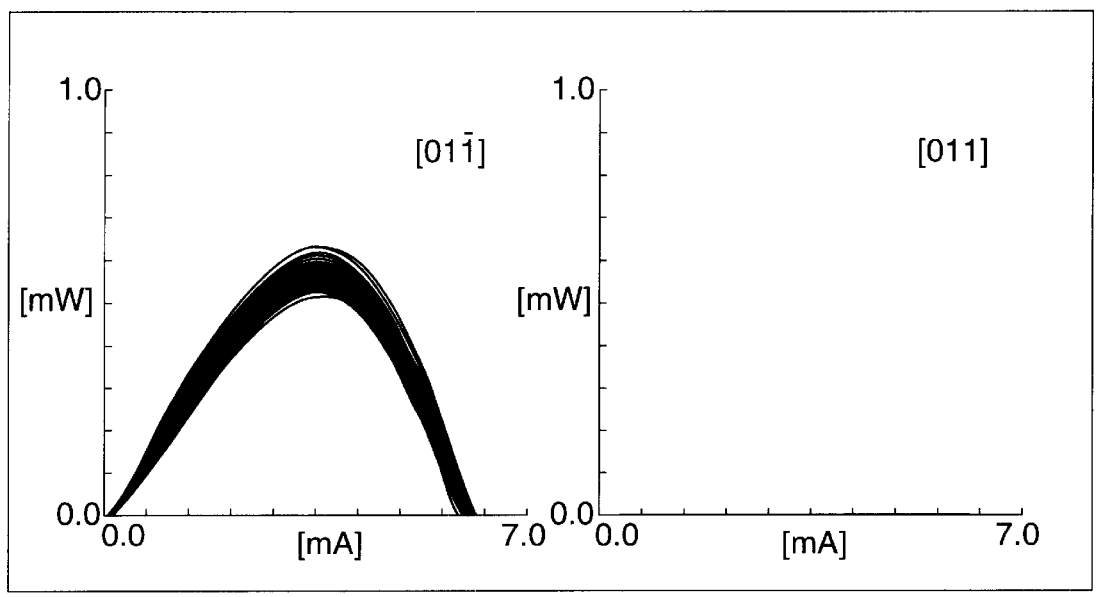
FIG. 10A is a graph of I-L properties obtained by polarization and separation to two directions intersecting at right angles in the surface emitting semiconductor laser array of the second embodiment of the present invention.
Figure 10B:
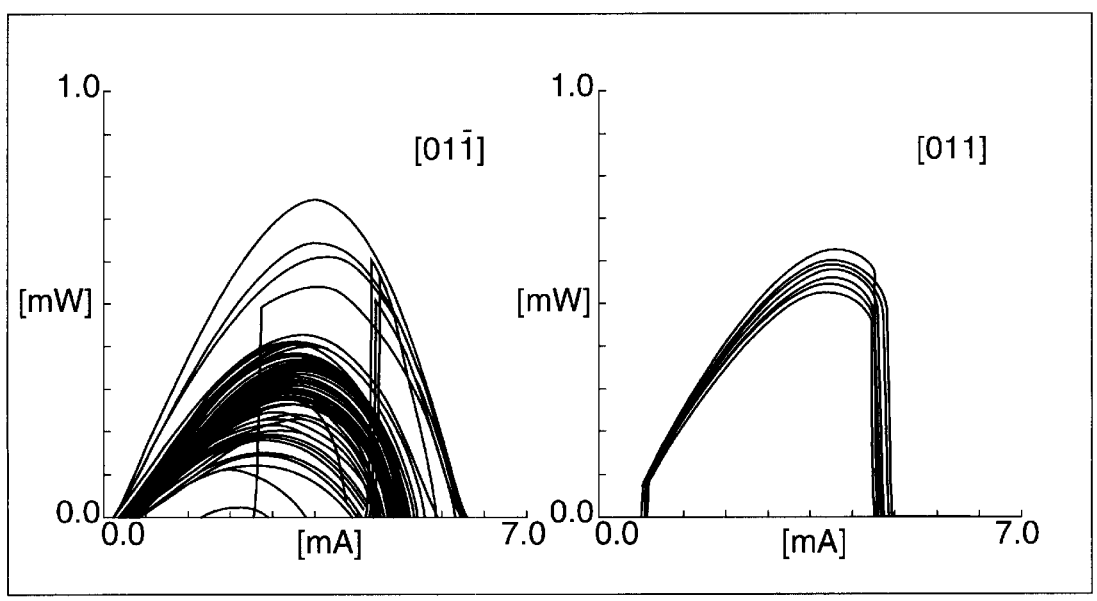
FIG. 10B shows the properties, measured for the purpose of comparison, of an array device that the off angle direction of a substrate and the extension direction of wirings intersect at right angles.

FIG. 10 shows polarization I-L properties of a thus fabricated surface emitting laser array of independent driving type which has an emission part of approximately 100 bits. For the purpose of comparison, there are also shown polarization I-L properties obtained for a device different from the above by 90° in the extension direction of the wirings. It will be appreciated from FIG. 10 that, for a device (a) matching between the off angle direction of the substrate and the extension direction of the wirings, polarization directions are perfectly controlled to the [01-1] direction, while, for a device (b) not matching between the off angle direction of the substrate and the extension direction of the metallic wirings 28, polarization directions are not fixed, switching of polarization direction occurs in specific current values, and polarization is not controlled.

In the first to third embodiments having been described above, the AlAs layer in which an oxidized region is formed in the circumferential part thereof has a higher Al composition ratio than that of two types of films ($Al_{0.9}Ga_{0.1}As$ film and $Al_{0.3}Ga_{0.7}As$ film) having mutually different Al composition ratios which constitute the first reflecting mirror layer and the second reflecting mirror layer. However, since there should occur, during thermal processing, a difference in oxidation speed with either of the two types of films, whichever has a higher Al composition ratio, as a layer in which an oxidized region is formed in the circumferential part thereof, an $Al_xGa_{1-x}As$ layer whose Al composition ratio (x) is 95% or more, preferably 98% or more, is satisfactory.

Since there is apprehension that p-type layers generally increase in device resistance due to band discontinuity, compared with n-type layers, taking this fact into account in the first and second embodiments, the conduction type of either of the two mirror layers disposed in opposed relation with each other, whichever has fewer layers and is at the light emission face, is defined as p type. However, the present invention is not limited to the p type, and the conduction types may be interchanged.

Although, in the first to third embodiments, emitted light is taken out from the surface on which the post part is formed, it may be taken out from the back of the GaAs substrate. In this case, the second reflecting mirror layer 18 located above the spacer layer should have more layers than the first reflecting mirror layer 12 located below the spacer layer to increase a relative reflection ratio.

Although the quantum well active layer is made of GaAs/AlGaAs semiconductor in the first to third embodiments, the present invention is not limited to this. For example, GaInP/InGaAlP semiconductor may be used for the quantum well active layer.

A heating temperature for selective oxidation for forming an oxidation region in a circumferential part, without being limited to 400° C., may be any temperature if the condition is satisfied which allows the size of a final current path to be controlled to a desired value. Although increased temperatures increase oxidation speeds and make it possible to form a desired oxidation region in a short time, approximately 400° C. is desirable because an oxidation distance is most easy to control.

The number of selective oxidation layers may be two or more to obtain the same effect, without being to limited to 1 as in the first and second embodiments.

As has been described above, a surface emitting semiconductor laser of the present invention brings about the anisotropy of oscillation threshold gains of optical mode and provides control of polarization to a given direction by using a semiconductor substrate tilted with respect to a plane containing a reference crystal axis, oxidizing a layer to be oxidized, from a circumferential part thereof, the layer having a circumferential shape that has no singular point and is macroscopically smooth, and forming a selective oxidation layer selectively oxidized in the circumferential part.

A laser array of the present invention has the effect that, since laser devices exhibit the anisotropy of oscillation threshold gains of optical mode and polarization is controlled in a given direction, there are no variations in polarization properties among the laser devices.

What is claimed is:

1. A surface emitting semiconductor laser in which upper and lower reflecting films are formed on a main face of a semiconductor substrate to sandwich an active layer, at least one of the upper and lower reflecting films including a selective oxidation layer, a circumferential part of the selective oxidation layer being oxidized, wherein the main face of the semiconductor substrate is tilted with respect to a face containing a reference crystal axis, and the selective oxidation layer is formed by oxidizing a layer to be oxidized from a circumferential edge of the layer to be oxidized, wherein the shape of the circumferential part of the selective oxidation layer, when cut by a face parallel to the main face, has at least no singular point and is macroscopically smooth.

2. The surface emitting semiconductor laser according to claim 1, wherein the face containing the reference crystal axis has a crystal face orientation crystallographically equivalent to (100) face.

3. The surface emitting semiconductor laser according to claim 2, wherein the main face is tilted at an angle in the range from −5° to +5° to [110] direction with respect to [100] direction.

4. The surface emitting semiconductor laser according to claim 1, wherein, when the layer to be oxidized is cut by a face parallel to the main face, a circumferential shape of the layer to be oxidized is circular or elliptic.

5. The surface emitting semiconductor laser according to claim 4, wherein, when the layer to be oxidized is cut by a face parallel to the main face, a circumferential shape of the layer to be oxidized is elliptic, and the direction of the major axis of the elliptic is [011] or [01-1] direction.

6. The surface emitting semiconductor laser according to claim 1, wherein a non-oxidation region of the selective oxidation layer has a diameter within a range in which fundamental transverse mode oscillation is obtained.

7. The surface emitting semiconductor laser according to claim 1, wherein an upper wiring is disposed at an upper portion of an emission part in a direction extended at an angle in the range from at least −10° to +10° with respect to the projection of the reference crystal axis to the semiconductor substrate main face.

8. A laser array of plural surface emitting semiconductor lasers in which upper and lower reflecting films are formed on a main face of a semiconductor substrate to sandwich an active layer, at least one of the upper and lower reflecting films including a selective oxidation layer for each surface emitting semiconductor laser, a circumferential part of the selective oxidation layer of each surface emitting semiconductor laser being oxidized, wherein the main face of the semiconductor substrate is tilted with respect to a face containing a reference crystal axis, and each selective oxidation layer is formed by oxidizing a layer to be oxidized from a circumferential edge of the layer to be oxidized, wherein the shape of the circumferential part of each selective oxidation layer, when cut by a face parallel to the main face, has at least no singular point and is macroscopically smooth.

9. The laser array according to claim 8, wherein an upper wiring is disposed at an upper portion of an emission part in a direction extended at an angle in the range from at least −10° to +10° with respect to a projection of the reference crystal axis to the main face of the semiconductor substrate.

* * * * *